United States Patent
Han et al.

(10) Patent No.: US 7,960,655 B2
(45) Date of Patent: Jun. 14, 2011

(54) PRINTED CIRCUIT BOARD, METHOD OF MANUFACTURING THE PRINTED CIRCUIT BOARD, MEMORY MODULE HAVING THE PRINTED CIRCUIT BOARD AND METHOD OF MANUFACTURING THE MEMORY MODULE

(75) Inventors: Seong-Chan Han, Cheonan-si (KR); Dong-Chun Lee, Cheonan-si (KR); Young-Soo Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 350 days.

(21) Appl. No.: 12/231,196

(22) Filed: Aug. 29, 2008

(65) Prior Publication Data
US 2009/0056979 A1 Mar. 5, 2009

(30) Foreign Application Priority Data
Sep. 3, 2007 (KR) .......................... 10-2007-0088906

(51) Int. Cl.
*H05K 1/00* (2006.01)
(52) U.S. Cl. ........ 174/252; 361/600; 361/688; 361/689; 361/698; 361/699; 361/700; 361/701; 361/702; 165/46; 165/80.4; 165/104.26; 165/151; 257/706; 257/712; 257/714
(58) Field of Classification Search .................. 174/252; 361/688, 600, 689, 698–702; 165/46, 80.4, 165/151, 104.26; 257/706, 712, 714
See application file for complete search history.

(56) References Cited

U.S. PATENT DOCUMENTS

| | | | | |
|---|---|---|---|---|
| 4,019,098 A * | 4/1977 | McCready et al. | ........... | 361/700 |
| 4,704,658 A * | 11/1987 | Yokouchi et al. | ............. | 361/698 |
| 4,793,405 A * | 12/1988 | Diggelmann et al. | ... | 165/104.33 |
| 5,009,263 A * | 4/1991 | Seshimo et al. | ............. | 165/151 |
| 5,283,715 A * | 2/1994 | Carlsten et al. | ............... | 361/702 |
| 5,349,831 A * | 9/1994 | Daikoku et al. | ................ | 62/376 |
| 5,422,787 A * | 6/1995 | Gourdine | ...................... | 361/697 |
| 5,727,618 A * | 3/1998 | Mundinger et al. | ......... | 165/80.4 |
| 5,763,951 A * | 6/1998 | Hamilton et al. | ............. | 257/714 |
| 5,891,291 A * | 4/1999 | Okamoto et al. | .......... | 156/273.9 |
| 5,998,240 A * | 12/1999 | Hamilton et al. | ............. | 438/122 |
| 6,016,251 A * | 1/2000 | Koide et al. | .................... | 361/699 |
| 6,617,154 B1 | 9/2003 | Meserol | ..................... | 435/285.2 |
| 6,621,698 B2 * | 9/2003 | Chang | ...................... | 361/679.47 |
| 6,986,382 B2 * | 1/2006 | Upadhya et al. | ............. | 165/80.4 |
| 7,134,486 B2 * | 11/2006 | Santiago et al. | ......... | 165/104.28 |
| 7,188,662 B2 * | 3/2007 | Brewer et al. | ................. | 165/80.4 |
| 7,305,843 B2 * | 12/2007 | Quisenberry et al. | ........ | 62/259.2 |
| 7,334,630 B2 * | 2/2008 | Goodson et al. | ......... | 165/104.33 |
| 7,637,311 B2 * | 12/2009 | Zheng et al. | ................. | 165/80.3 |
| 7,672,129 B1 * | 3/2010 | Ouyang et al. | ................ | 361/699 |

(Continued)

FOREIGN PATENT DOCUMENTS
JP 5-29717 2/1993
(Continued)

*Primary Examiner* — Xiaoliang Chen
(74) *Attorney, Agent, or Firm* — Mills & ONello, LLP

(57) ABSTRACT

A PCB can include an insulating member, a cooling member, and a circuit pattern. The cooling member can be built into the insulating member. The cooling member can have a cooling passageway through which a cooling fluid can flow. The circuit pattern can be formed on the insulating member. Thus, high heat in the circuit pattern can be rapidly dissipated by the cooling fluid flowing through the cooling passageway.

9 Claims, 7 Drawing Sheets

U.S. PATENT DOCUMENTS

| | | | |
|---|---|---|---|
| 2001/0011585 A1* | 8/2001 | Cassidy et al. | 165/46 |
| 2003/0116309 A1* | 6/2003 | Dispenza et al. | 165/151 |
| 2003/0210527 A1* | 11/2003 | Saita et al. | 361/700 |
| 2004/0257750 A1* | 12/2004 | Saita et al. | 361/600 |
| 2005/0019311 A1* | 1/2005 | Holaday et al. | 424/93.7 |
| 2005/0178529 A1* | 8/2005 | Suzuki | 165/80.4 |
| 2006/0012034 A1* | 1/2006 | Kadoya et al. | 257/712 |
| 2007/0034356 A1* | 2/2007 | Kenny et al. | 165/80.4 |
| 2007/0230185 A1* | 10/2007 | Shuy | 362/294 |
| 2008/0205002 A1* | 8/2008 | Chui | 361/699 |
| 2009/0065180 A1* | 3/2009 | Wits et al. | 165/104.26 |

FOREIGN PATENT DOCUMENTS

| | | |
|---|---|---|
| JP | 2000-138485 | 5/2000 |
| KR | 10-2005-0117482 | 12/2005 |
| KR | 10-2006-0111015 | 10/2006 |

* cited by examiner

PRINTED CIRCUIT BOARD, METHOD OF MANUFACTURING THE PRINTED CIRCUIT BOARD, MEMORY MODULE HAVING THE PRINTED CIRCUIT BOARD AND METHOD OF MANUFACTURING THE MEMORY MODULE

PRIORITY STATEMENT

This application claims priority under 35 U.S.C. §119 to Korean Patent Application No. 10-2007-0088906 filed on Sep. 3, 2007 in the Korean Intellectual Property Office (KIPO), the contents of which are herein incorporated by reference in their entirety.

BACKGROUND OF THE INVENTION

1. Field of the Invention

The present invention relates to a printed circuit board (PCB), a method of manufacturing the PCB, a memory module having the PCB, and a method of manufacturing the memory module. More particularly, the present invention relates to a PCB on which semiconductor packages are mounted, a method of manufacturing the PCB, a memory module having the PCB, and a method of manufacturing the memory module.

2. Description of the Related Art

Recently, as a speed of a central processing unit (CPU) has increased, there have been continuous endeavors to increase a speed and an integration degree of a main memory to improve a capacity of a system including the CPU. In order to increase input/output speed of data into/from the main memory, a bus structure capable of rapidly transmitting/receiving a packet can be arranged between the CPU and the main memory. Further, in order to increase a memory capacity of the main memory, a memory module including the memory that can be mounted on a printed circuit board (PCB) can be widely used.

The memory module can be classified into a single in-line memory module (SIMM) and a dual in-line memory module (DIMM). The SIMM can include semiconductor packages mounted on only one face of a PCB. In contrast, the DIMM can include semiconductor packages mounted on both faces of a PCB.

The main memory can have an increased memory capacity due to the memory module. Further, in order to improve the input/output speed of the data into/from the memory, it can be required to increase a transmission speed of the data by heightening a clock frequency of the memory. Furthermore, in order to provide the memory with a large capacity, it can be necessary to mount a plurality of the memory modules on a motherboard by increasing numbers of the memory module or numbers of slots in the motherboard.

However, when the clock frequency of the memory can be increased, the memory can have a reduced timing margin. Further, when the numbers of the slots can be increased, many loads can be generated on a transmission path of a signal, so that the signal transmission can become weak. In order to compensate the generation of the loads, a registered DIMM can be proposed.

The registered DIMM can include a phase locked loop (PLL), a register and a plurality of memories. When the registered DIMM is mounted on a motherboard, the generation of the loads can be compensated. However, when the slots are too many in number or the clock frequency can be too high, a reflective wave can be generated on the transmission path to reduce transmission efficiency.

To overcome the above-mentioned problems, a fully buffered DIMM (FBDIMM) can be proposed. The FBDIMM can include an advanced memory buffer (AMB) for providing external signals to the semiconductor packages. That is, in the FBDIMM, the external signals can be transmitted to the semiconductor packages via the AMB. Thus, signal lines through which the signals can flow can be connected to the AMB. Therefore, a burdensome load can be applied to the AMB. As a result, high heat can be generated from the AMB.

The high heat can shorten a life span of the AMB. Further, the high heat can badly affect operational reliability of the AMB. Thus, it can be required to rapidly dissipate the high heat from the AMB. Therefore, the AMB can include a heat spreader for dissipating the high heat from the AMB.

However, the heat spreader can increase a thickness of the memory module. Further, it can be required to perform additional processes for assembling the heat spreader into the memory module.

SUMMARY

In accordance with aspects of the present invention, provided is a printed circuit board (PCB) that has an improved heat dissipation capacity without an additional heat spreader.

In accordance with aspects of the present invention, also provided is a method of manufacturing the above-mentioned PCB.

In accordance with aspects of the present invention, also provided is a memory module having the above-mentioned PCB.

In accordance with aspects of the present invention, also provided is a method of manufacturing the above-mentioned memory module.

A PCB in accordance with one aspect of the present invention can include an insulating member, a cooling member and a circuit pattern. The cooling member can be formed in the insulating member. The cooling member can have a cooling passageway configured to enable flow of a cooling fluid through the cooling member. The circuit pattern can be formed on the insulating member.

The insulating member can include a first insulating layer formed on an upper surface of the cooling member.

The insulating member can also include a second insulating layer formed on a lower surface of the cooling member.

The cooling member can include a rectangular parallelepiped duct having an inlet and an outlet. The inlet can be in fluid communication with the cooling passageway and exposed through a first side surface of the insulating member and can be configured to allow an inflow of the cooling fluid into the cooling passageway. The outlet can be in fluid communication with the cooling passageway and exposed through a second side surface of the insulating member opposite to the first side surface, and can be configured to allow an outflow of the cooling fluid from the cooling passageway.

The cooling passageway and the circuit pattern can extend in a first direction substantially in parallel, and the cooling passageway can be arranged under the circuit pattern.

The cooling member can have an auxiliary cooling passageway in fluid communication with the cooling passageway and configured to receive an auxiliary cooling fluid.

The auxiliary cooling passageway can extend in a second direction substantially perpendicular to the first direction.

The auxiliary cooling passageway can have an auxiliary inlet in fluid communication with the auxiliary cooling passageway and exposed through a third side surface of the insulating member substantially perpendicular to the first and the second side surfaces and configured to receive the auxiliary cooling fluid into the auxiliary cooling passageway, and an auxiliary outlet in fluid communication with the auxiliary cooling passageway and exposed through a fourth side surface of the insulating member opposite to the third side surface and configured to discharge the auxiliary cooling fluid from the auxiliary cooling passageway.

The circuit pattern can include a first pattern formed on an upper surface of the insulating member, and a second pattern formed on a lower surface of the insulating member.

In accordance with another aspect of the present invention, provided is a method of manufacturing a PCB including arranging a cooling member in an insulating member. The cooling member can have a cooling passageway through which a cooling fluid can flow. A circuit pattern can be formed on the insulating member.

Forming the circuit pattern can include forming a first pattern on an upper surface of the insulating member, and forming a second pattern on a lower surface of the insulating member.

In accordance with another aspect of the present invention, provided is a memory module including a PCB and semiconductor packages. The PCB includes an insulating member, a cooling member, and a circuit pattern. The cooling member can be built into the insulating member. The cooling member can have a cooling passageway configured to enable flow of a cooling fluid through the cooling member. The circuit pattern can be formed on the insulating member. The semiconductor packages can be mounted on the circuit pattern.

The cooling passageway and the semiconductor packages can extend in a first direction substantially in parallel, and the cooling passageway can be arranged under the semiconductor packages.

The cooling member can have an auxiliary cooling passageway in fluid communication with the cooling passageway. An auxiliary cooling fluid can flow through the auxiliary cooling passageway. The auxiliary cooling passageway can extend in a second direction substantially perpendicular to the first direction.

The auxiliary passageway can be arranged beneath the semiconductor packages.

The auxiliary passageway can be arranged between the semiconductor packages.

The auxiliary cooling passageway can have an auxiliary inlet in fluid communication with the auxiliary cooling passageway and exposed through a side surface of the insulating member and configured to introduce the auxiliary cooling fluid into the auxiliary cooling passageway, and an auxiliary outlet in fluid communication with the auxiliary cooling passageway and exposed through an upper surface of the insulating member and configured to discharge the auxiliary cooling fluid from the auxiliary cooling passageway.

The circuit pattern can include a first pattern formed on an upper surface of the insulating member, and a second pattern formed on a lower surface of the insulating member. Further, the semiconductor packages can include first packages mounted on the first circuit pattern, and second packages mounted on the second pattern.

In accordance with another aspect of the present invention, provided is a method of manufacturing a memory module wherein a cooling member is formed in the insulating member. The cooling member can have a cooling passageway through which a cooling fluid can flow. A circuit pattern can be formed on the insulating member. Semiconductor packages can be mounted on the circuit pattern.

Forming the circuit pattern can include forming a first pattern on an upper surface of the insulating member, and forming a second pattern on a lower surface of the insulating member. Further, mounting the semiconductor packages can include mounting first packages on the first circuit pattern, and mounting second packages on the second pattern.

The cooling member can be built into the insulating member. The cooling fluid can flow through the cooling passageway of the cooling member in the insulating member. Thus, the PCB can have improved heat dissipation characteristic without a heat spreader. Further, it is not required to provide the memory module having the PCB with the heat spreader. Therefore, an additional process for assembling the heat spreader into the memory module can not be necessary. Further, the memory module can have a thin thickness.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DETAILED DESCRIPTION OF PREFERRED EMBODIMENTS

Figure 1:
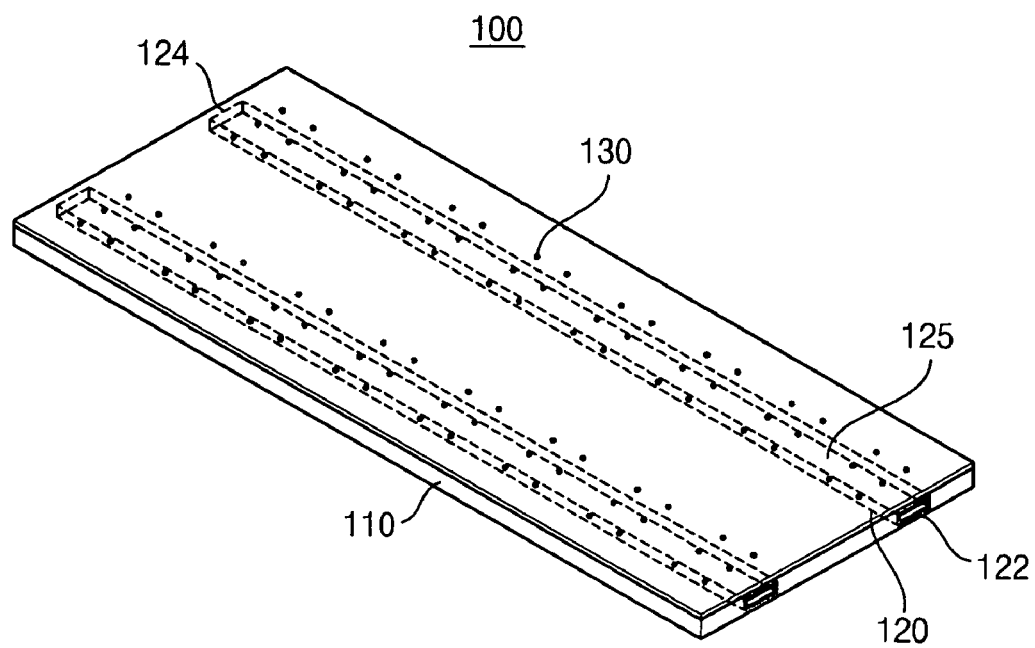
FIG. 1 is a perspective view illustrating an example embodiment of a printed circuit board (PCB) in accordance with aspects of the present invention.

Aspects of the present invention will be apparent through description of example embodiments in accordance therewith, which are described hereinafter with reference to the accompanying drawings. The present invention can, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers can be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. can be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device can be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments described herein with reference to cross-sectional illustrations are schematic illustrations of idealized example embodiments (and intermediate structures) in accordance with aspects of the present invention. As such, variations from the shapes of the illustrations as a result, for example, of manufacturing techniques and/or tolerances, are to be expected. Thus, the example embodiments described herein should not be construed as limited to the particular shapes of regions illustrated herein, but are to be considered to include deviations in shapes that result, for example, from manufacturing processes and considerations. For example, an implanted region illustrated as a rectangle will, typically, have rounded or curved features and/or a gradient of implant concentration at its edges rather than a binary change from implanted to non-implanted region. Likewise, a buried region formed by implantation can result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Hereinafter, some example embodiments in accordance with aspects of the present invention will be explained in detail with reference to the accompanying drawings.

Printed Circuit Board

Figure 2:
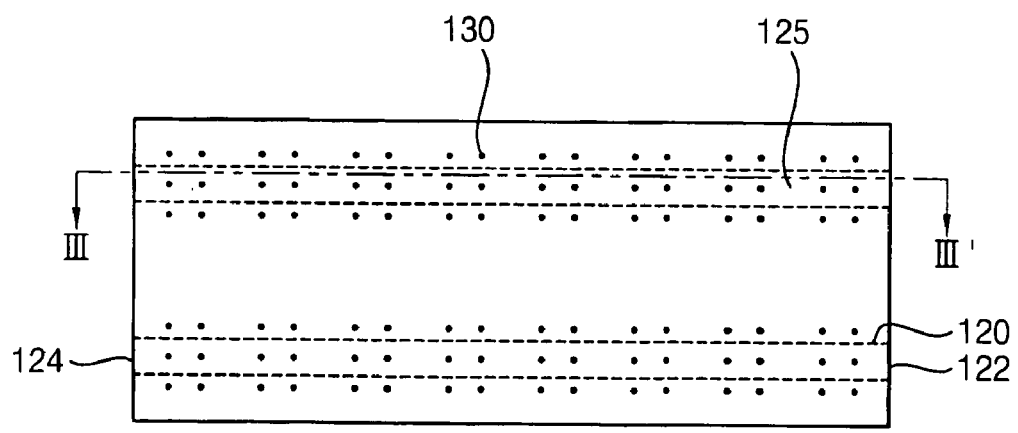
FIG. 2 is a plan view illustrating the PCB in FIG. 1.
Figure 3:
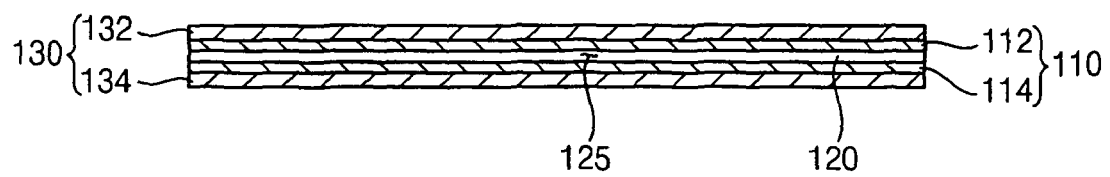
FIG. 3 is a cross-sectional view taken along a line III-III' in FIG. 2.
Figure 4:
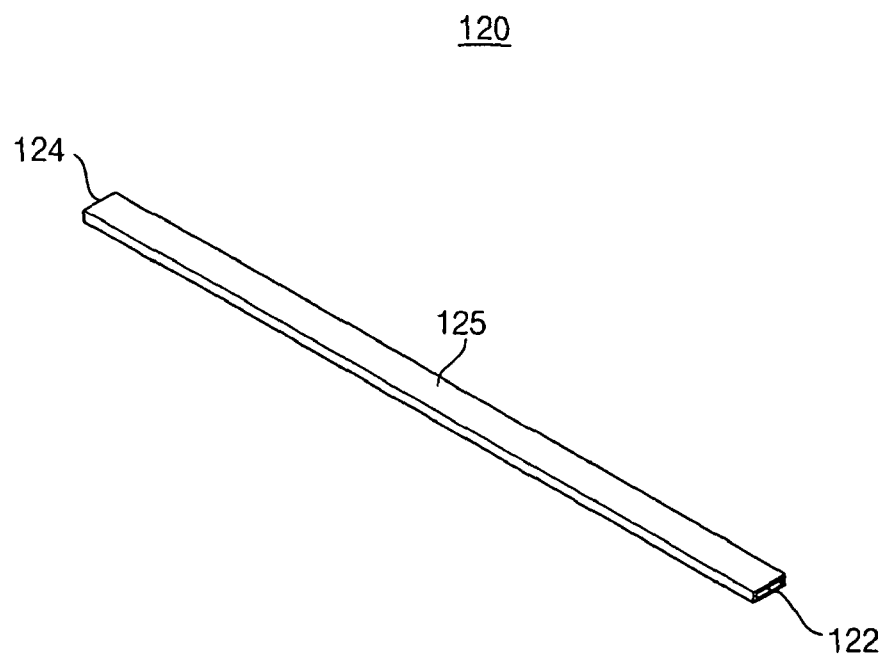
FIG. 4 is a perspective view illustrating an example embodiment of a cooling member of the PCB in FIG. 1.

FIG. 1 is a perspective view illustrating an example embodiment of a printed circuit board (PCB) in accordance with aspects of the present invention, FIG. 2 is a plan view illustrating the PCB in FIG. 1, FIG. 3 is a cross-sectional view taken along a line III-III' in FIG. 2, and FIG. 4 is a perspective view illustrating an example embodiment of a cooling member of the PCB in FIG. 1.

Referring to FIGS. 1 to 4, a printed circuit board (PCB) 100 of this example embodiment can include an insulating member 110, a cooling member 120 and a circuit pattern 130.

The insulating member 110 can have a thin plate rectangular shape. Thus, the insulating member 110 can have a first side surface, a second side surface opposite to the first side surface, a third side surface substantially perpendicular to the first and the second side surfaces, and a fourth side surface opposite to the third side surface. Further, the insulating member 110 can have an upper surface and a lower surface. The insulating member 110 can include a first insulating layer 112. The insulating member can also include a second insulating layer 114 arranged under the first insulating layer 112. In this example embodiment, the insulating member 110 can include resin, as an example.

The cooling member 120 can be built into the insulating member 110. The cooling member 120 can have a rectangular parallelepiped shape, such as a thin plate shape. Thus, the cooling member 120 can have a thickness less than that of the insulating member 110, in this embodiment. Further, the cooling member 120 can have a length substantially the same as that of the insulating member 110.

The cooling member 120 can have a cooling passageway 125 through which a cooling fluid can flow. At each end of the cooling passageway, the cooling member 120 can have an open end. One open end of the cooling member 120 can correspond to an inlet 122 for allowing an inflow of the cooling fluid. The other open end of the cooling member 120 can correspond to an outlet 124 for allowing an outflow of the cooling fluid. The inlet 122 and the outlet 124 can be in fluid communication with each other via the cooling passageway 125. The inlet 122 can be exposed through the first side surface of the insulating member 110. The outlet 124 can be exposed through the second side surface of the insulating member 110. In this example embodiment, the cooling member 120 can take the form of a duct having a thin plate shape. Further, the cooling fluid can include a cooling fluid such as, for example, air. Additionally, a fan (not shown) can be coupled to the inlet 122. In this case, as an example, cooling air can be forcibly introduced into the cooling passageway 125 via the inlet 122 using the fan.

The circuit pattern 130 can include a first pattern 132 arranged on the upper surface of the insulating member 110, and a second pattern 134 arranged on the lower surface of the insulating member 110. In this example embodiment, the first pattern 132 and the second pattern 134 can be arranged in two rows along a first direction. Further, the circuit pattern 130 can include a thin copper pattern, or a pattern formed of another material or composition having good thermal conductivity properties.

In other embodiments, where there are multiple rows of circuit patterns, rather than having a separate cooling member for each row, a single cooling member could have a width sufficient extend across more than one row.

Here, a heat emitting element (not shown), such as a semiconductor package, can be mounted on the circuit pattern 130. Thus, the cooling member 120 can be positioned under the circuit pattern 130. That is, the cooling passageway 125 of the cooling member 120 can extend in the first direction to rapidly dissipate high heat generated from the semiconductor package, and thermally conducted through the circuit pattern.

According to this example embodiment, the high heat generated from the circuit pattern can be rapidly dissipated due to the cooling fluid flowing through the cooling member. Thus, the PCB can have improved heat dissipation characteristic without an additional heat spreader, typically used in other PCBs. As a result, it may not be necessary to perform an additional process and invest any additional cost for the heat spreader, as well as achieving greater simplicity and less bulk and weight, without adversely affecting thermal dissipation properties of the PCB.

Figure 5:
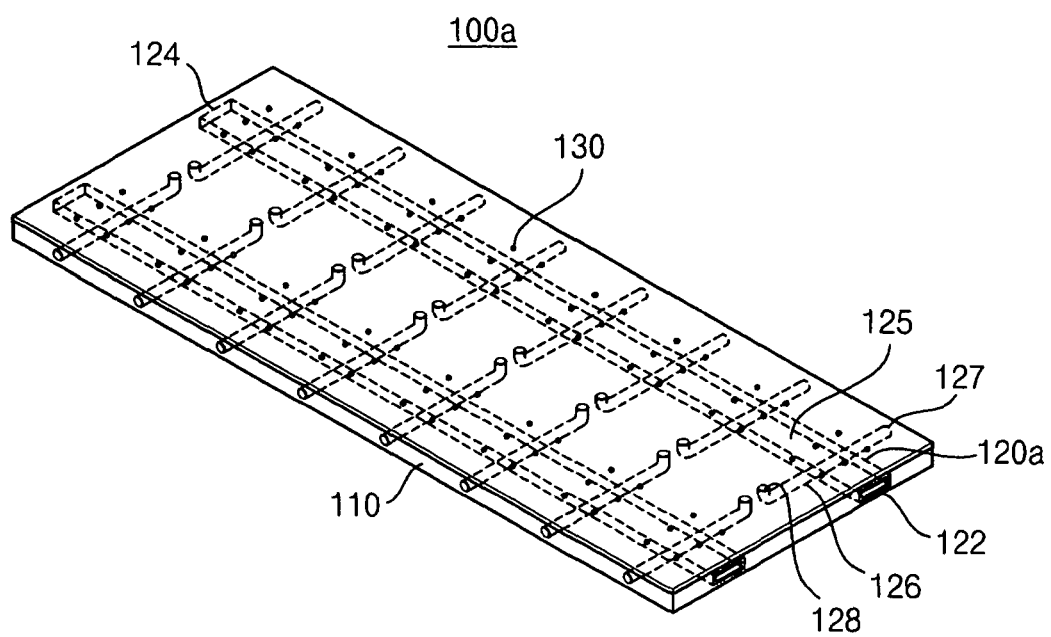
FIG. 5 is a perspective view illustrating another example embodiment of a printed circuit board (PCB) in accordance with aspects of the present invention.
Figure 6:
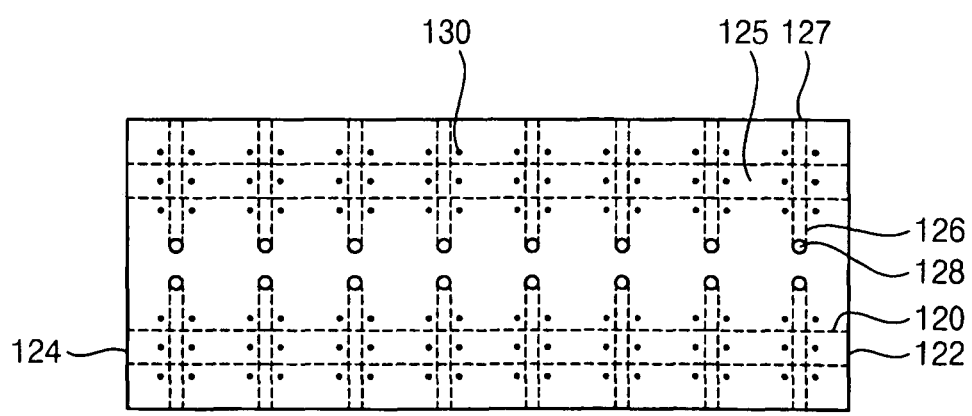
FIG. 6 is a plan view illustrating the PCB in FIG. 5.
Figure 7:
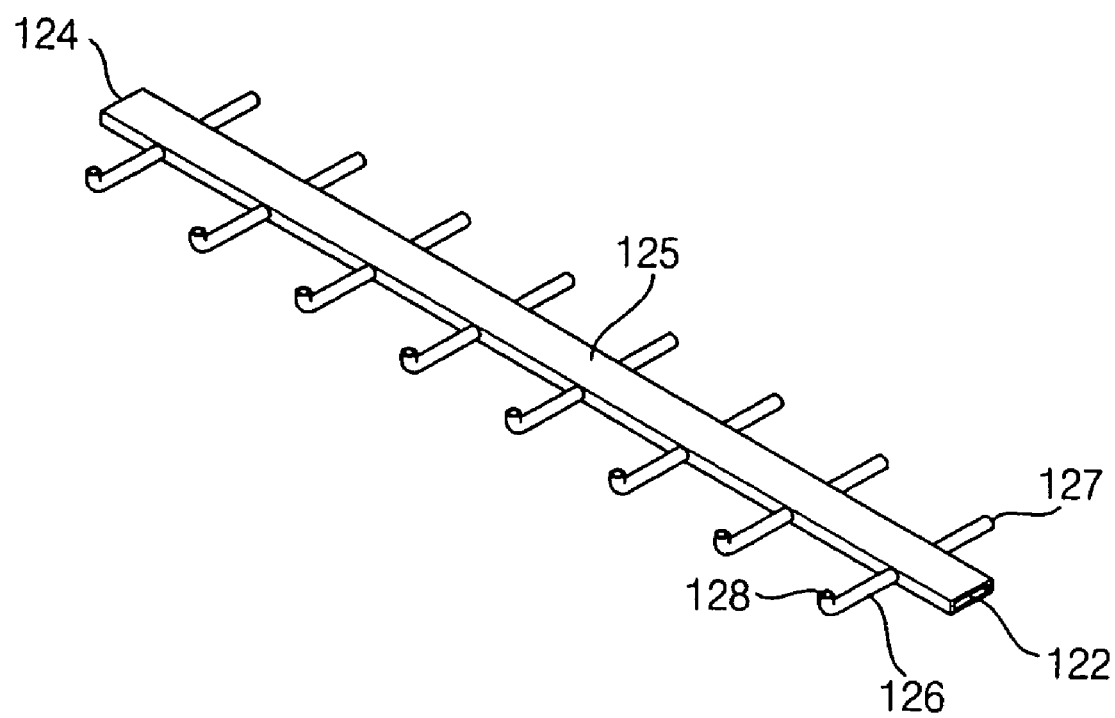
FIG. 7 is a perspective view illustrating an example embodiment of a cooling member of the PCB in FIG. 5.

FIG. 5 is a perspective view illustrating an example embodiment of a printed circuit board (PCB) in accordance with another aspect of the present invention, FIG. 6 is a plan view illustrating the PCB in FIG. 5, and FIG. 7 is a perspective view illustrating another embodiment of a cooling member of the PCB in FIG. 5.

The PCB 100a of this example embodiment can include elements substantially the same as those of the PCB 100 in FIG. 1, except for the cooling member 120. Thus, where there is commonality the same reference numerals refer to the same elements, and any further illustrations with respect to the same elements are omitted herein for brevity.

Referring to FIGS. 5 to 7, a cooling member 120a of the PCB 100a in accordance with this example embodiment can have the cooling passageway 125 connected between the inlet 122 and the outlet 124, and an auxiliary cooling passageway 126. The cooling passageway 125 can extend in a first direction.

The auxiliary cooling passageway 126 can be placed under the circuit pattern 130. Thus, an auxiliary cooling fluid flowing through the auxiliary cooling passageway 126 can rapidly dissipate high heat generated from the circuit pattern 130 using the flowing cooling fluid. The auxiliary cooling passageway 126 can extend in a second direction substantially perpendicular to the first direction. The auxiliary cooling passageway 126 can be in fluid communication with the cooling passageway 125.

The auxiliary cooling passageway 126 can have an auxiliary inlet 127 and an auxiliary outlet 128. The auxiliary inlet 127 can be exposed through the third side surface of the insulating member 110. In contrast, the auxiliary outlet 128 can be exposed through the upper surface of the insulating member 110, in this embodiment. That is, in this example embodiment, the circuit pattern 130 can be arranged in two rows. Thus, when the auxiliary outlet 128 extends toward the fourth side surface of the insulating member 110, the auxiliary outlet 128 may interfere with an adjacent cooling member. To prevent such interference, the auxiliary outlet 128 can be exposed through the upper surface of the insulating member 110 between the circuit patterns 130. In contrast, when the circuit pattern 130 can be arranged in one row, the auxiliary outlet 128 can be exposed through the fourth side surface of the insulating member 110, as another embodiment. In other embodiments, plural auxiliary passageways can share a common outlet, e.g., be connected at their respective outlets. In some embodiments, when there are multiple rows, an auxiliary passageway can extend across the multiple rows such that a single auxiliary passageway is in fluid communication with more than one cooling passageway.

In this example embodiment, the auxiliary cooling fluid can be substantially the same as the cooling fluid, e.g., air. In this case, the cooling fluid flowing through the cooling passageway 125 can be introduced into the auxiliary cooling passageway 126 without the auxiliary cooling fluid being introduced into the auxiliary cooling passageway 126 via the auxiliary inlet 127.

According to this example embodiment, the cooling member can have the cooling passageway and the auxiliary cooling passageway. Thus, the high heat generated from the circuit pattern can be more rapidly dissipated.

Method of Manufacturing a PCB

Figure 8:
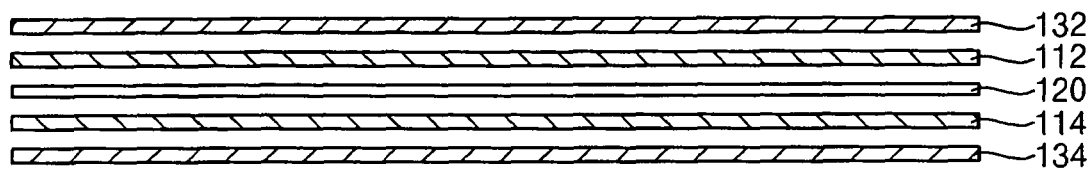
FIGS. 8 and 9 are cross-sectional views illustrating an example embodiment of a method of manufacturing the PCB in FIG. 1.
Figure 9:
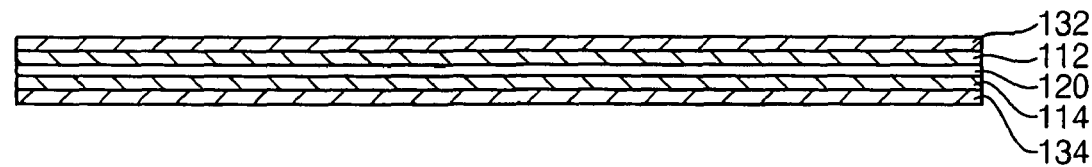

FIGS. 8 and 9 are cross-sectional views illustrating an embodiment of a method of manufacturing the PCB in FIG. 1.

Referring to FIG. 8, the first insulating layer 112 can be arranged over the cooling member 120. The second insulating layer 114 can be placed under the cooling member 120. Further, the first pattern 132 can be arranged over the first insulating layer 112. And the second pattern 134 can be placed under the second insulating layer 114.

Referring to FIG. 9, the first pattern 132 and the second pattern 134 can be compressed to complete the PCB 100 having the cooling member 120 in FIG. 1.

Alternatively, the cooling member 120 can be interposed between the first insulating layer 112 and the second insulating layer 114. The first insulating layer 112 and the second insulating layer 114 can be attached to each other. A conductive foil can be formed on the first insulating layer 112 and the second insulating layer 114. The conductive foil can be patterned to form the circuit pattern 130.

Here, the PCB 100a in FIG. 5 can be manufactured by processes substantially the same as the processes illustrated for PCB 100 with reference to FIGS. 8 and 9, except for the shape of the cooling member. Thus, any further illustrations with respect to the method of manufacturing the PCB 100a are omitted herein for brevity.

Memory Module

Figure 10:
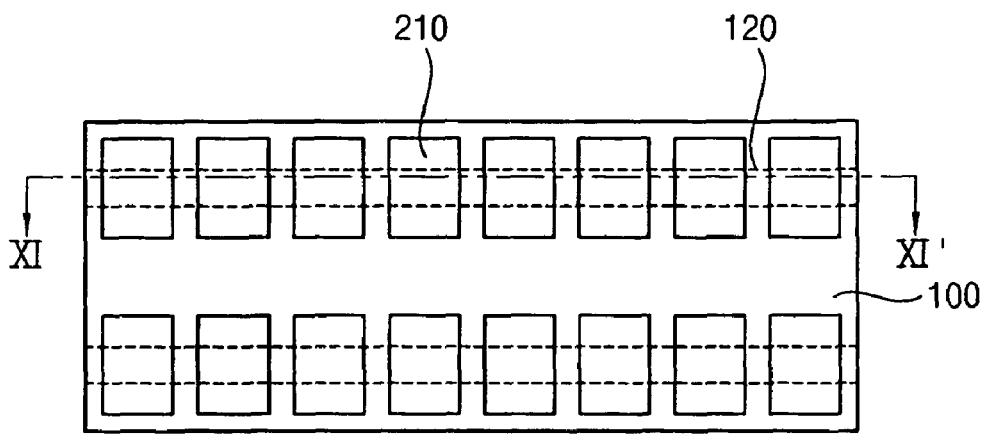
FIG. 10 is a plan view illustrating an example embodiment of a memory module in accordance with aspects of the present invention.
Figure 11:
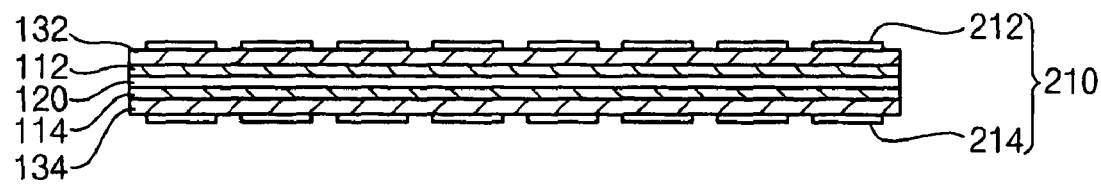
FIG. 11 is a cross-sectional view taken along a line XI-XI' in FIG. 10.

FIG. 10 is a plan view illustrating an example embodiment of a memory module in accordance with aspects of the present invention, and FIG. 11 is a cross-sectional view taken along a line XI-XI' in FIG. 10.

Referring to FIGS. 10 and 11, a memory module 200 of this example embodiment can include a PCB 100 and a semiconductor package 210.

Here, the PCB 100 can be substantially the same as the PCB in FIG. 1. Thus, any further illustrations with respect to the PCB 100 can be omitted herein for brevity.

The semiconductor package 210 can include first packages 212 and second packages 214. The first packages 212 can be mounted on the first pattern 132. The second packages 214 can be mounted on the second pattern 134. Since the cooling member 120 can be located under the semiconductor package 210, the cooling fluid flowing through the cooling member 120 can rapidly dissipate high heat generated from the semiconductor package 210 external to the memory module 200.

Here, the memory module 200 of this example embodiment can correspond to a dual in-line memory module (DIMM) where the semiconductor packages 210 can be arranged on both surfaces of the DIMM. Further, the memory module 200 of this example embodiment can correspond to a fully buffered DIMM (FBDIMM) having an advanced memory buffer (AMB) that can provide external signals to the semiconductor packages 210. Alternatively, the memory module 200 of this example embodiment can correspond to a single in-line memory module (SIMM) where the semiconductor packages 210 can be arranged only on one surface of the SIMM.

Figure 12:
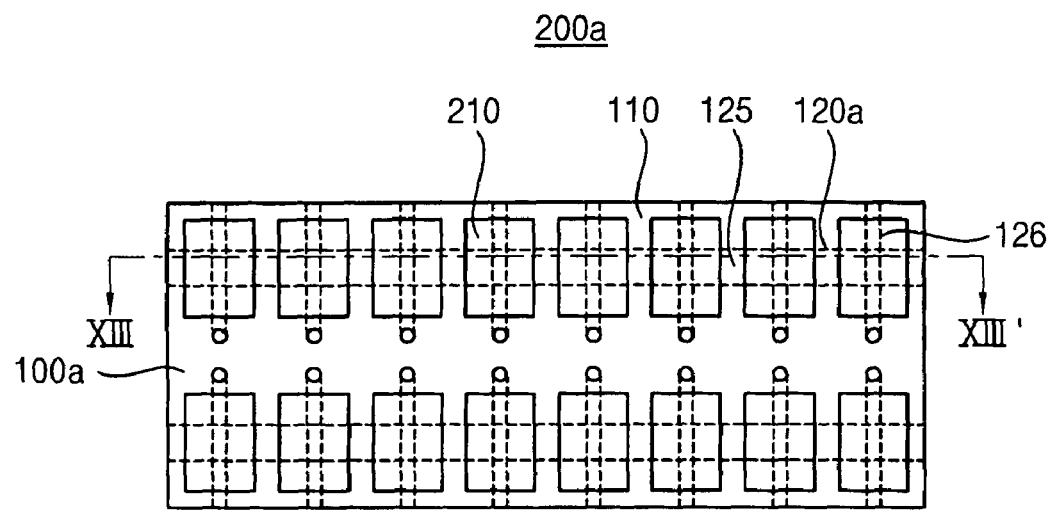
FIG. 12 is a plan view illustrating another example embodiment of a memory module in accordance with aspects of the present invention.
Figure 13:
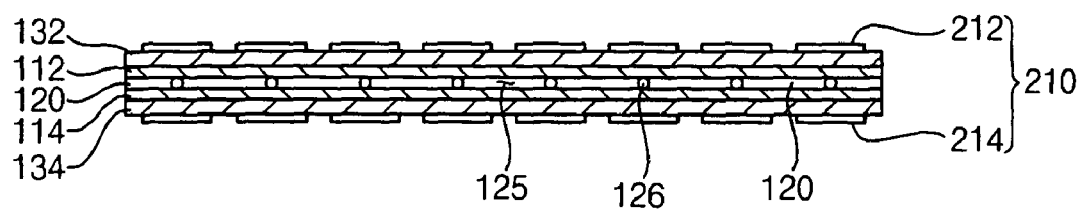
FIG. 13 is a cross-sectional view taken along a line XIII-XIII' in FIG. 12.

FIG. 12 is a plan view illustrating an example embodiment of a memory module in accordance with aspects of the present invention, and FIG. 13 is a cross-sectional view taken along a line XIII-XIII' in FIG. 12.

Referring to FIGS. 12 and 13, a memory module 200a of this example embodiment can include a PCB 100a and a semiconductor package 210.

Here, the PCB 100a can be substantially the same as the PCB in FIG. 5. Thus, any further illustrations with respect to the PCB 100a can be omitted herein for brevity. Further, the semiconductor package 210 can be substantially the same as the semiconductor package in FIG. 10. Thus, any further illustrations with respect to the semiconductor package 210 can be omitted herein for brevity.

According to this example embodiment, the cross-arranged cooling passageway 125 and auxiliary cooling passageway 126 can be located under the semiconductor package 210. Thus, the high heat generated from the semiconductor package 210 can be more rapidly dissipated to the outside of the memory module 200a.

In another embodiment, the auxiliary passageway can be arranged between the semiconductor packages. In other embodiments, some auxiliary passageways can be arranged between the semiconductor packages and others arranged under the semiconductor packages.

Method of Manufacturing a Memory Module

Method of manufacturing the memory modules in FIGS. 10 and 12 can include the methods of manufacturing the PCBs 100 and 100a in FIGS. 1 and 5, and mounting the semiconductor 210 on the circuit pattern 130. Thus, any further illustrations with respect to the methods of manufacturing the memory modules can be omitted herein for brevity.

According to some example embodiments, the cooling member can be built into the PCB. Thus, the PCB can have improved heat dissipation characteristic without an additional heat spreader.

Further, it may not be necessary to provide the memory module having the PCB with the heat spreader. Therefore, it may not be required to perform an additional process for assembling the heat spreader into the memory module. Further, since the memory module need not have the heat spreader, the memory module can have be thinner.

The foregoing is illustrative of aspects of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of aspects of the present invention and is not to be construed as limited to the specific example embodiments disclosed, and that modifications to the disclosed example embodiments, as well as other example embodiments, are intended to be included within the scope of the appended claims. The present invention is defined by the following claims, with equivalents of the claims to be included therein.

What is claimed is:

1. A printed circuit board (PCB) comprising:
an insulating member;
a cooling member in the insulating member, the cooling member having a cooling passageway configured to enable flow of a cooling fluid through the cooling member, wherein the cooling member comprises a rectangular parallelepiped duct having an inlet and an outlet, wherein:
the inlet is configured to allow an inflow of the cooling fluid and is in fluid communication with the cooling passageway and exposed through a first side surface of the insulating member, and
the outlet is configured to allow an outflow of the cooling fluid and is in fluid communication with the cooling passageway and exposed through a second side surface of the insulating member opposite to the first side surface; and
a circuit pattern having a substantially planar first pattern formed on an upper surface of the insulating member and a substantially planar second pattern formed on a lower surface of the insulating member,
wherein the insulating member and cooling member are sandwiched between the first pattern and the second pattern of the circuit pattern,
wherein the cooling passageway and the circuit pattern extend in a first direction substantially in parallel, and the cooling passageway is arranged under the circuit pattern,
wherein the cooling member further comprises an auxiliary cooling passageway in fluid communication with the cooling passageway and configured to receive an auxiliary cooling fluid, and
wherein the auxiliary cooling passageway comprises:
an auxiliary inlet in fluid communication with the auxiliary cooling passageway and exposed through a third side surface of the insulating member substantially perpendicular to the first and the second side surfaces and is configured to receive the auxiliary cooling fluid into the auxiliary cooling passageway; and
an auxiliary outlet in fluid communication with the auxiliary cooling passageway and exposed through a fourth side surface of the insulating member opposite to the third side surface and is configured to discharge the auxiliary cooling fluid from the auxiliary cooling passageway.

2. The PCB of claim 1, wherein the insulating member comprises:
a first insulating layer formed on an upper surface of the cooling member.

3. The PCB of claim 2, wherein the insulating member further comprises:
a second insulating layer formed on a lower surface of the cooling member.

4. The PCB of claim 1, wherein the auxiliary cooling passageway extends in a second direction substantially perpendicular to the first direction.

5. The PCB of claim 1, wherein the circuit pattern comprises:
a first pattern formed on an upper surface of the insulating member; and
a second pattern formed on a lower surface of the insulating member.

6. A memory module comprising:
a printed circuit board (PCB) including:
an insulating member;
a cooling member in the insulating member, the cooling member having a cooling passageway configured to enable flow a cooling fluid through the cooling member; and
a circuit pattern having a substantially planar first pattern formed on an upper surface of the insulating member and a substantially planar second pattern formed on a lower surface of the insulating member,
wherein the insulating member and cooling member are sandwiched between the first pattern and the second pattern of the circuit pattern; and semiconductor packages mounted on the circuit pattern,
wherein the cooling passageway and semiconductor packages extend in a first direction substantially in parallel, wherein the cooling passageway is arranged under the semiconductor packages, wherein the cooling member further comprises an auxiliary cooling passageway in fluid communication with the cooling passageway and configured to receive an auxiliary cooling fluid, and wherein the auxiliary cooling passageway extends in a second direction substantially perpendicular to the first direction, and wherein the auxiliary cooling passageway comprises:

an auxiliary inlet in fluid communication with the auxiliary cooling passageway and exposed through a side surface of the insulating member and configured to introduce the auxiliary cooling fluid into the auxiliary cooling passageway;

an auxiliary outlet in fluid communication with the auxiliary cooling passageway and exposed through an upper surface of the insulating member and configured to discharge the auxiliary cooling fluid from the auxiliary cooling passageway.

7. The memory module of claim 6, wherein the auxiliary passageway is arranged beneath the semiconductor packages.

8. The memory module of claim 6, wherein the auxiliary passageway is arranged between the semiconductor packages.

9. The memory module of claim 6, wherein the circuit pattern comprises a first pattern formed on an upper surface of the insulating member, and a second pattern formed on a lower surface of the insulating member, and wherein the semiconductor packages comprise first packages mounted on the first pattern, and second packages mounted on the second pattern.

* * * * *